US006801313B1

(12) United States Patent
Yokota

(10) Patent No.: US 6,801,313 B1
(45) Date of Patent: Oct. 5, 2004

(54) OVERLAY MARK, METHOD OF MEASURING OVERLAY ACCURACY, METHOD OF MAKING ALIGNMENT AND SEMICONDUCTOR DEVICE THEREWITH

(75) Inventor: Kazuki Yokota, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 482 days.

(21) Appl. No.: 09/627,456

(22) Filed: Jul. 27, 2000

(30) Foreign Application Priority Data

Jul. 28, 1999 (JP) .......................................... 11/213720

(51) Int. Cl.⁷ .......................... G01B 11/00; G01B 11/14; G03F 9/00; G03C 5/00; H01L 21/4763
(52) U.S. Cl. .......................... 356/401; 356/622; 430/5; 430/314; 430/316; 438/620; 438/624; 438/660; 428/172; 428/201; 378/35
(58) Field of Search ................................ 356/401, 399, 356/614, 622; 430/5, 314, 316; 438/620, 624, 660; 428/172, 201; 378/35

(56) References Cited

U.S. PATENT DOCUMENTS

| | | | |
|---|---|---|---|
| 5,128,280 A | | 7/1992 | Matsumoto et al. ........ 438/504 |
| 5,356,686 A | | 10/1994 | Fujioka et al. ............. 428/64.1 |
| 5,525,840 A | * | 6/1996 | Tominaga ................... 257/797 |
| 5,578,423 A | | 11/1996 | Bae ............................ 430/314 |
| 5,627,083 A | * | 5/1997 | Tounai ........................ 438/18 |
| 5,635,336 A | * | 6/1997 | Bae ............................ 430/314 |
| 6,218,200 B1 | * | 4/2001 | Chen et al. .................... 438/14 |
| 6,251,547 B1 | * | 6/2001 | Izu et al. ....................... 430/5 |
| 6,316,328 B1 | * | 11/2001 | Komuro ....................... 438/401 |
| 6,319,791 B1 | * | 11/2001 | Ando ........................... 438/401 |
| 6,368,980 B1 | * | 4/2002 | Minami et al. .............. 438/737 |
| 6,498,401 B2 | * | 12/2002 | Yokota ........................ 257/797 |
| 6,610,448 B2 | * | 8/2003 | Sato et al. ...................... 430/5 |

FOREIGN PATENT DOCUMENTS

| | | |
|---|---|---|
| JP | 64-42128 | 2/1989 |
| JP | 1-196822 | 8/1989 |
| JP | 1-272116 | 10/1989 |
| JP | 08-17718 | 1/1996 |
| JP | 08-273997 | 10/1996 |
| JP | 9-167730 | 6/1997 |
| JP | 9-251945 | 9/1997 |
| JP | 9-283581 | 10/1997 |
| JP | 9-306821 | 11/1997 |
| JP | 10-4044 | 1/1998 |
| JP | 10-160413 | 6/1998 |
| JP | 11-8178 | 1/1999 |
| JP | 11-317340 | 11/1999 |
| JP | 2000-133560 | 5/2000 |

\* cited by examiner

*Primary Examiner*—Rodney Fuller
*Assistant Examiner*—Magda Cruz
(74) *Attorney, Agent, or Firm*—McGinn & Gibb, PLLC

(57) ABSTRACT

The present invention relates to an overlay mark used for the measurement of the overlay accuracy between layered patterns and alignment at the time of exposure; which has a grooved pattern surrounding a mark pattern that is formed by engraving a groove or an indent in a prescribed position on a layer where a circuit pattern is formed so as to protect this mark pattern from being deformed by thermal expansion or contraction of this layer. The present invention enables to form a multi-layered circuit pattern with a high accuracy and a high yield in production, even in the formation of a minute and densely-spaced circuit pattern.

27 Claims, 15 Drawing Sheets

(a)      (b)

(a)

(b)

(a)

(b)

(a)

(b)

(a)

(b)

(a)

(b)

(a)

(b)

OVERLAY MARK, METHOD OF MEASURING OVERLAY ACCURACY, METHOD OF MAKING ALIGNMENT AND SEMICONDUCTOR DEVICE THEREWITH

BACKGROUND OF THE INVENTION

1. Field of the Invention

The present invention relates to an overlay mark that is used in the step of lithography during a manufacturing process of a semiconductor device, a liquid crystal panel or the like, to measure the overlay accuracy between patterns formed on a substrate, or to make alignment in superimposing a mask onto a wafer at the time of exposure. Further, the present invention relates to a method of measuring the overlay accuracy and a method of making alignment, with such marks being utilized, and also relates to a semiconductor device having a substrate on which such marks are formed.

2. Description of the Related Art

In lithographic techniques employed for the production of a semiconductor device, a liquid crystal panel and the like, it is particularly important to form a minute pattern with precision and, at the same time, superimpose this pattern onto an underlying layer with accuracy.

For this purpose, in the step of lithography during these manufacturing processes, when a second circuit pattern is formed to overlay a first circuit pattern, alignment to superimpose a mask onto a wafer is made at the time of exposure and, then, after patterning is carried out by means of exposure and development, the overlay accuracy between the patterns formed in this manner is measured.

Once the overlay accuracy between the formed patterns is measured, patterns having a defective overlay accuracy, that is, patterns between which the overlay deviation is above a prescribed value are removed, and thereby the success rate of pattern formation is improved. This underlines the importance of the accurate measurement of the overlay accuracy.

To measure this overlay accuracy, various overlay mark with patterns have been hitherto being utilized (Japanese Patent Application Laid-open No. 251945/1997, No. 160413/1998 and such). Typical examples, each with a top view and a cross-sectional view, are shown in FIGS. 12–15. FIG. 12 presents a box-in-box type mark; FIG. 13, a frame-in-box type mark; FIG. 14, a frame-in-frame type mark and FIG. 15, a bar-in-bar type mark.

A box-in-box type mark has a depressed lower-layer pattern 1 in the shape of a quadrangle viewed from the top, and an upper-layer pattern 2 with a quadrangular top that is smaller than the lower-layer pattern 1 and formed inside of that, as shown in FIG. 12.

A frame-in-box type mark has a lower-layer pattern 1 in the shape of a quadrangular frame viewed from the top, and an upper-layer pattern 2 with a quadrangular top that is smaller than the lower-layer pattern 1 and formed inside of that, as shown in FIG. 13.

A frame-in-frame type mark has a lower-layer pattern 1 in the shape of a quadrangular frame viewed from the top, and an upper-layer pattern 2 in the shape of a quadrangular frame that is smaller than the lower-layer pattern 1 and formed inside of that, as shown in FIG. 14.

A bar-in-bar type mark has a lower-layer pattern 1 in which four bar-shaped patterns are each disposed in place of a side of a quadrangle, and an upper-layer pattern 2 that is similar in shape and formed inside of the lower-layer pattern 1, as shown in FIG. 15.

In any of these marks, the lower-layer pattern 1 is formed by engraving an underlying layer 3 and the upper-layer pattern 2 is formed with a resist layer that is formed on an upper layer 4 laid over the underlying layer 3.

The upper-layer pattern 2 in the box-in-box type mark and in the frame-in-box type mark, shown in FIG. 12 and FIG. 13, respectively, are each formed by laying a quadrangular prism of resist block on the upper layer 4. However, an upper-layer pattern in these marks can be formed negatively by providing as depressed section (an indent) or an opening section in the shape of a polygon on a resist layer. The upper-layer pattern 2 in the frame-in-frame type mark and in the bar-in-bar type mark, shown in FIG. 14 and FIG. 15, respectively, are each formed by engraving a grooved pattern in the shape of a frame or bars on a resist layer 2a. However, an upper-layer pattern in these marks can be formed of resist block in the shape of a frame or bars.

To measure the overlay accuracy with an overlay mark of this sort, the lower-layer pattern is first formed onto the underlying layer 3 and, then, after the upper layer 4 is formed over this underlying layer 3, the upper-layer pattern 2 is formed with the resist layer that is applied thereto. Using both of these lower-layer pattern 1 and upper-layer pattern 2, the overlay accuracy is measured. For the measurement of the overlay accuracy, an optical image-processing type overlay measuring apparatus is normally used and the light intensity profile of the reflected light travelling from the overlay mark for measuring the overlay accuracy is obtained. The central positions of the lower-layer pattern and upper-layer pattern are each calculated from the light intensity profile and a shift between these central positions is taken as the overlay accuracy.

Meanwhile, in the step of exposure in which circuit patterns formed on a plurality of masks are transcribed onto a single semiconductor wafer using a stepper, an electron beam exposure system or the like, what is important is that, in order to prevent relative positions between transcribed patterns from shifting, the positions of each mark and the wafer must be aligned with a high accuracy, or, in other words, the alignment accuracy must be kept high.

A method to align a wafer and a mask, for example, proceeds as follows. Firstly, an overlay mark (an alignment mark) to recognize a prescribed position of a wafer is formed on the wafer, and, with this alignment mark being irradiated with a light or an electron beam, the position of the alignment mark is detected, making use of the diffracted light or reflected electrons from the alignment mark, and, then, on the basis of this detected position, an appropriate alignment is made by moving an X-Y stage. Such an alignment mark is formed in a prescribed position of a dicing line of the wafer or such, by engraving an underlying layer by means of etching, with a pattern shown in FIG. 16, for example, a line and space pattern (FIG. 16(a)) comprising bar-shaped grooves, a pattern of a plurality of parallel arrays (FIG. 16(b)) each of which is a pattern comprising square indents in a line, or the like (Japanese Patent Application Laid-open No. 42128/1989, No. 4044/1998 and such). Through the detection of the position of such an alignment mark comprising grooves or indents, the alignment is made.

However, in recent years, accompanied with achievement of further miniaturization and more densely-placed arrangement of elements, the standard required for the overlay accuracy has been rising. With the conventional overlay mark described above, it has become considerably difficult to satisfy demands that the measurement of the overlay accuracy and the alignment should be made with a sufficient accuracy to fit recent technical developments.

The overlay mark is generally formed on a dicing line. However, as the arrangement of elements becomes still more densely spaced, this overlay mark has become formed much closer to a circuit pattern. Around the overlay mark that is formed close to a circuit pattern, variation in structural environment may arise. When a heating during the manufacturing process brings about thermal expansion or contraction of the layer on which the mark is formed, the overlay mark may undergo non-uniform deformation due to difference in the extent of expansion or contraction resulting from this variation in structural environment. The deformation of this kind caused by thermal expansion or contraction is particularly pronounced, when the layer on which the overlay mark is formed is a film having an amorphous structure such as a BPSG (Boro-Phospho-Silicate Glass) film, a CVD (Chemical Vapour Deposition) silicon oxide film or the like. The deformation of the overlay mark reduces the alignment accuracy and the accuracy of measurement for the overlay accuracy, and lowers the yield and the quality of the products and, therefore, with miniaturization proceeding, it has become a problem of utmost importance.

The deformed state of an overlay mark is schematically shown in FIG. 17, taking the case of the frame-in-box type overlay mark shown in FIG. 13. FIG. 17(a) is a plan view and FIG. 17(b), a cross-sectional view taken along the line A–A of FIG. 17(a).

While no pattern but the pattern for the overlay mark is present in the vicinity of the left section 1a of the lower-layer pattern 1, a pattern 5 for an adjacent circuit is disposed close to the right section 1b of the lower-layer pattern 1. When a heating is applied to this pattern layout, the amount of thermal contraction of the underlying layer lying in the region on the left of the lower-layer pattern 1a is greater than the amount of thermal contraction of the underlying layer lying in the small region contained between the lower-layer pattern 1b and the adjacent circuit pattern 5 so that the lower-layer pattern 1a deforms badly. Consequently, the position of the lower-layer pattern cannot be located accurately and the accuracy of the measurement for the overlay accuracy is lowered. The same happens in the box-in-box type mark, the frame-in-frame type mark, the bar-in-bar type mark and the alignment mark.

SUMMARY OF THE INVENTION

An object of the present invention is to form a multi-layered circuit pattern with a high accuracy and a high yield in production, even in the formation of a minute and densely-spaced circuit pattern.

The present invention relates to an overlay mark having a mark pattern formed by engraving a groove or an indent in a prescribed position on a layer where a circuit pattern is formed, and a grooved pattern that surrounds said mark pattern so as to protect said mark pattern from being deformed by thermal expansion or contraction of said layer.

Further, the present invention relates to an overlay mark used for measuring the overlay accuracy in forming a second circuit pattern over a first circuit pattern; which has:

a first lower-layer pattern formed by engraving a groove or an indent in a prescribed position on a first layer where the first circuit pattern is formed, and an upper-layer pattern formed in a prescribed position on a second layer where the second circuit pattern is to be formed; and, in addition, a second lower-layer pattern that is formed by engraving, on the first layer, a frame-shaped groove to surround the first lower-layer pattern, and is not used for measuring the overlay accuracy.

Further, the present invention relates to an overlay mark used for making alignment to detect and decide an aligning position of a wafer and a mask, in the step of exposure during photolithography to form a second circuit pattern over a first circuit pattern; which has:

a first pattern formed by engraving a groove or an indent in a prescribed position on a layer where the first circuit pattern is formed; and a second pattern that is formed by engraving a frame-shaped groove to surround the first pattern, and is not used for making alignment.

Further, the present invention relates to a semiconductor device having a substrate on which the overlay mark of the present invention described above is formed.

Further, the present invention relates to a method of measuring the overlay accuracy in forming a second circuit pattern over a first circuit pattern, wherein the overlay mark of the present invention described above is used but, at least, the outermost lower-layer pattern is not utilized to detect an overlay position.

Further, the present invention relates to a method of making alignment to detect and decide an aligning position of a wafer and a mask, in the step of exposure during photolithography to form a second circuit pattern over a first circuit pattern, wherein the overlay mark of the present invention described above is used but, at least, the outermost pattern is not utilized to detect an aligning position.

The present invention enables to form a multi-layered circuit pattern with a high accuracy and a high yield in production, even in the formation of a minute and densely-spaced circuit pattern for a semiconductor device, a liquid crystal panel or the like.

The present invention is particularly well suited for the case in which the first layer where the first circuit pattern is formed is a thermally soft film with an amorphous structure, for example, a CVD oxide film or an oxide glass containing boron and phosphuorus, such as a BPSG film or the like.

DETAILED DESCRIPTION OF THE PREFERRED EMBODIMENTS

Taking the cases of the preferred embodiments, the present invention is described in detail below.

First Embodiment

An overlay mark of the present invention has a first lower-layer pattern formed by engraving a groove on an underlying layer where a first circuit pattern is formed, and a second lower-layer pattern that is formed by engraving, on the underlying layer, a frame-shaped groove to surround the first lower-layer pattern, so as to protect the first lower-layer pattern from being deformed by thermal expansion or contraction of the underlying layer.

Figure 1:
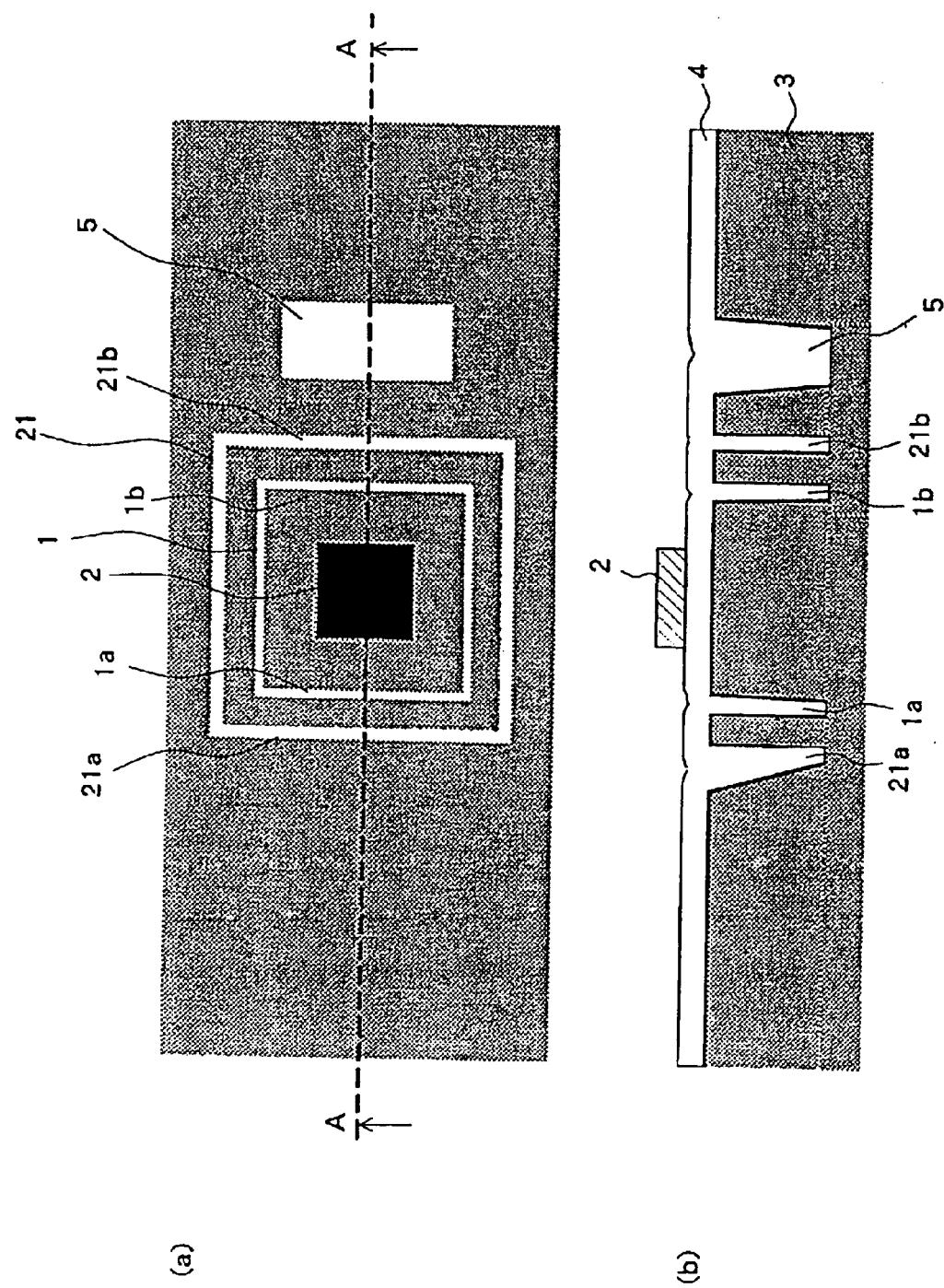
FIGS. 1(a) and 1(b) are a pair of schematic views illustrating the shape and the effect of an overlay mark that is one example of the present invention.
Figure 2:
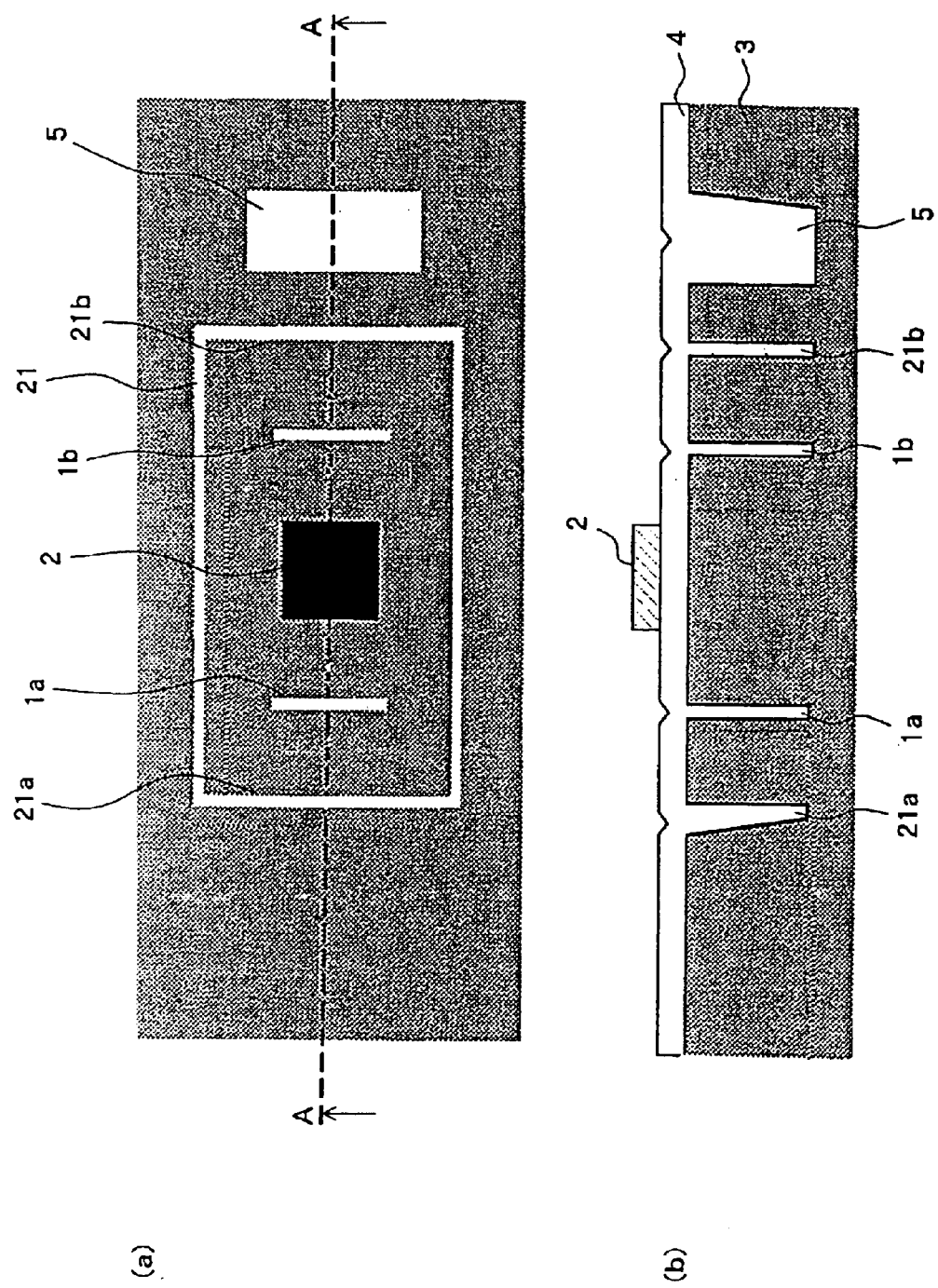
FIGS. 2(a) and 2(b) are a pair of schematic views illustrating the shape and the effect of another overlay mark that is another example of the present invention.
Figure 3:
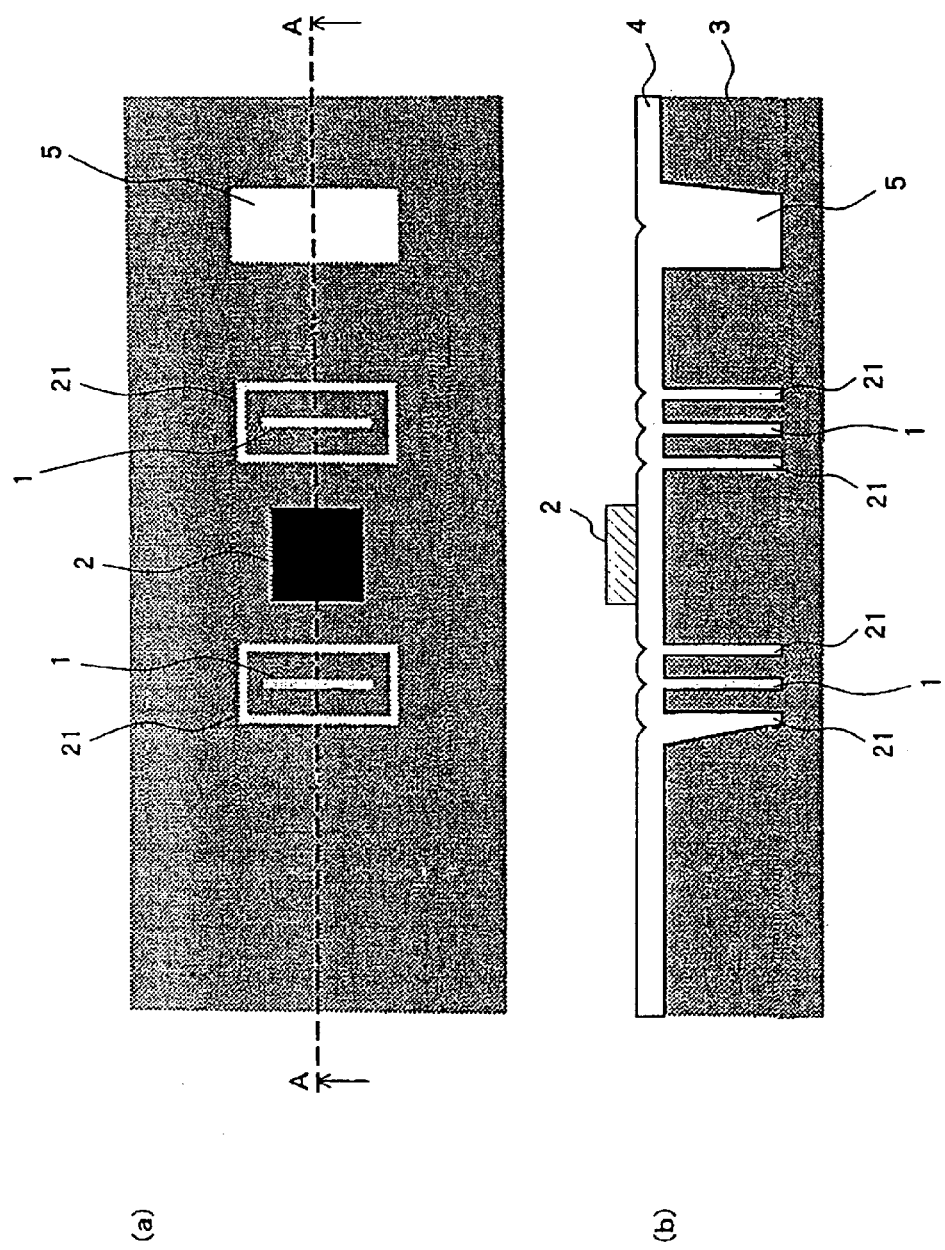
FIGS. 3(a) and 3(b) are a pair of schematic views illustrating the shape and the effect of another overlay mark that is another example of the present invention.
Figure 4:
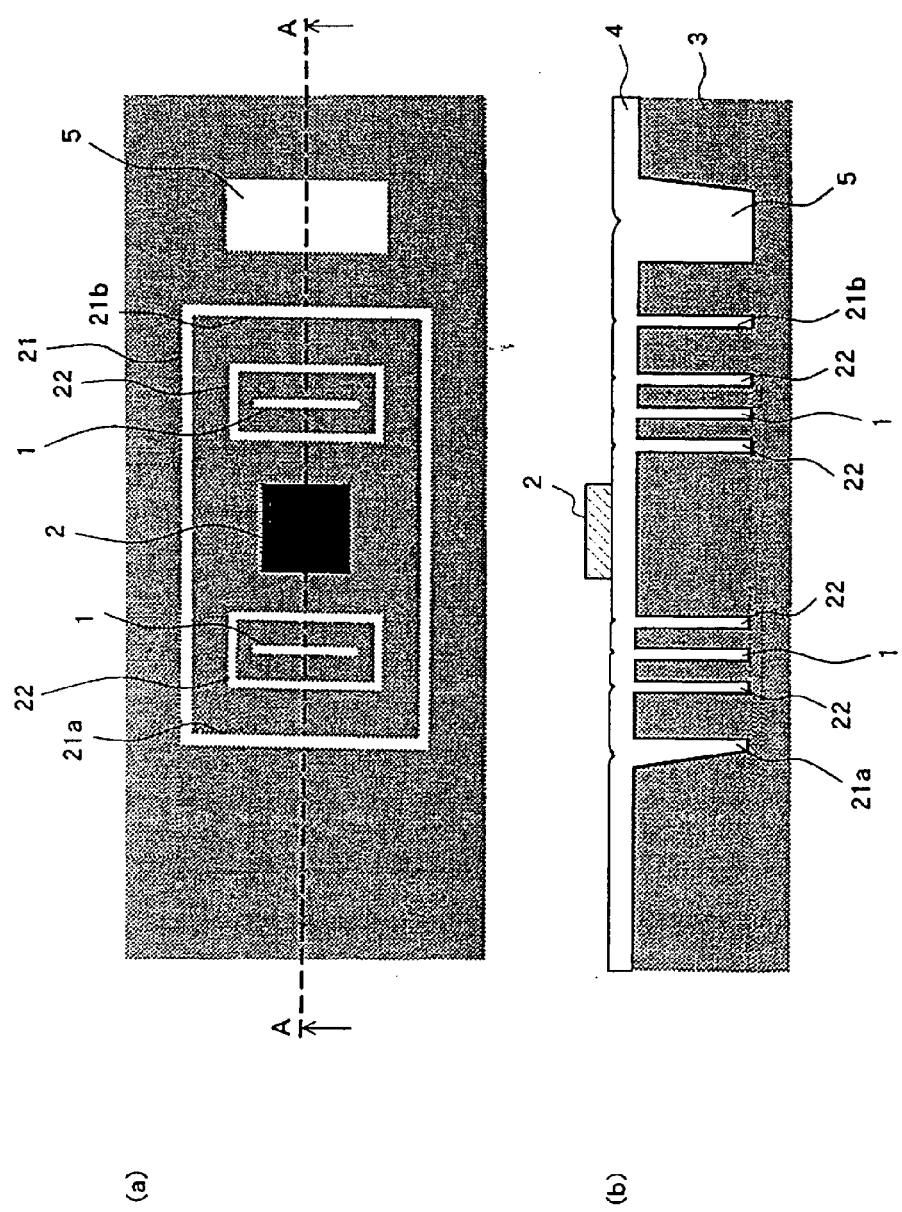
FIGS. 4(a) and 4(b) are a pair of schematic views illustrating the shape and the effect of another overlay mark that is another example of the present invention.

As one embodiment of this, an example in which the present invention is applied to a frame-in-box type mark is described, with reference to FIG. 1. FIG. 1(a) is a plan view and FIG. 1(b) is a cross-sectional view taken along the line A—A of FIG. 1(a). Here, FIG. 1(a) shows the mark before deformation and FIG. 1(b), the mark after deformation due to thermal contraction. FIGS. 2–4 follow the case.

As shown in FIG. 1, in an overlay mark of the present embodiment, a first lower-layer pattern 1 formed by engraving a frame-shaped groove on an underlying layer 3 (a first layer) is surrounded by a second lower-layer pattern 21 formed similarly by engraving a frame-shaped groove.

With a pattern layout in which such a second lower-layer pattern 21 is additionally formed, the structural environment around the circumferential region of the first lower-layer pattern 1 becomes constant, notwithstanding the disposition of an adjacent circuit pattern close to the overlay mark. In the pattern layout shown in FIG. 1, while no adjacent circuit pattern is present in the vicinity of a pattern section 1a of the lower-layer pattern 1, an adjacent circuit pattern 5 is disposed nearby on the right of a pattern section 1b of the first lower-layer pattern 1 and, thus, the structural environment around a mark made of a second lower-layer pattern 21 is non-uniform. When a heating is applied thereto as much as to make the underlying layer 3 contract thermally, a pattern section 21a of the second lower-layer pattern 21 is deformed due to this thermal contraction, which, however, relaxes the contraction inside of the second lower-layer pattern and, therefore, with respect to the pattern section 1a of the first lower-layer pattern 1, the deformation thereof is prevented. For the measurement of the overlay accuracy, without using the deformed second lower-layer pattern 21, only the first lower-layer pattern 1 prevented from being deformed and the upper-layer pattern 2 are utilized. In this manner, the overlay accuracy can be measured with a high accuracy, and a high rate of success can be attained. Further, while FIG. 1(b) illustrates the case in which the underlying layer 3 contracts on heating, the underlying layer 3 may expand with heat. In that case, by setting the width of a groove in the second lower-layer pattern 21 sufficiently large, the amount of expansion of the underlying layer 3 can be absorbed and modified as much as the width of this groove, and thereby the inside part of the first lower-layer pattern can be protected from deformation.

Figure 6:
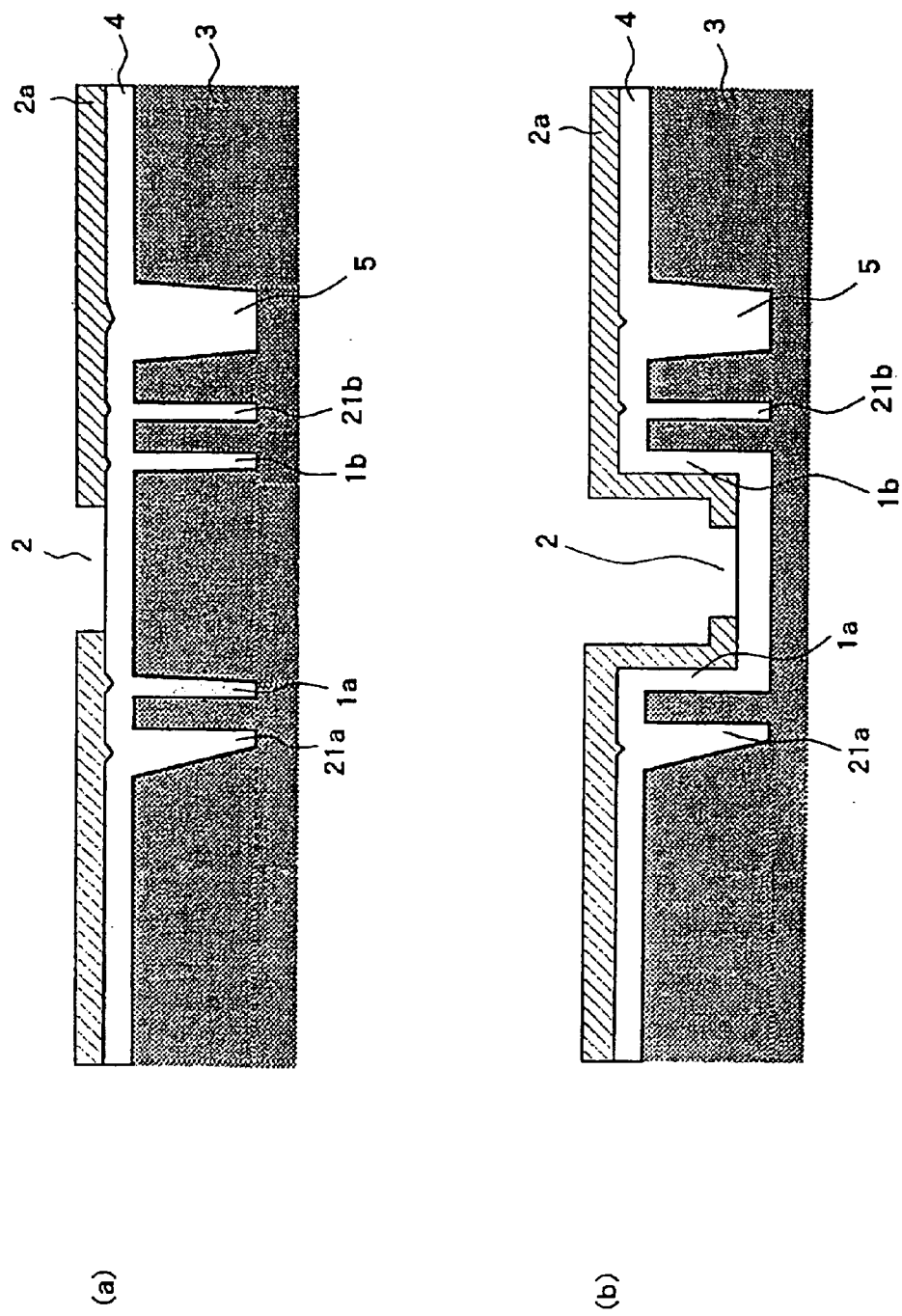
FIGS. 6(a) and 6(b) are a pair of schematic views illustrating the shape and the effect of another overlay mark that is another example of the present invention.
Figure 14:
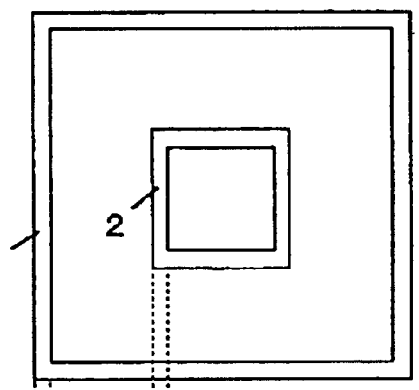
FIGS. 14(a) and 14(b) are a pair of schematic views showing another example of a conventional overlay mark.
Figure 14:
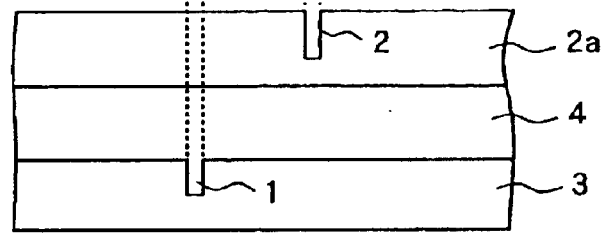
Figure 15:
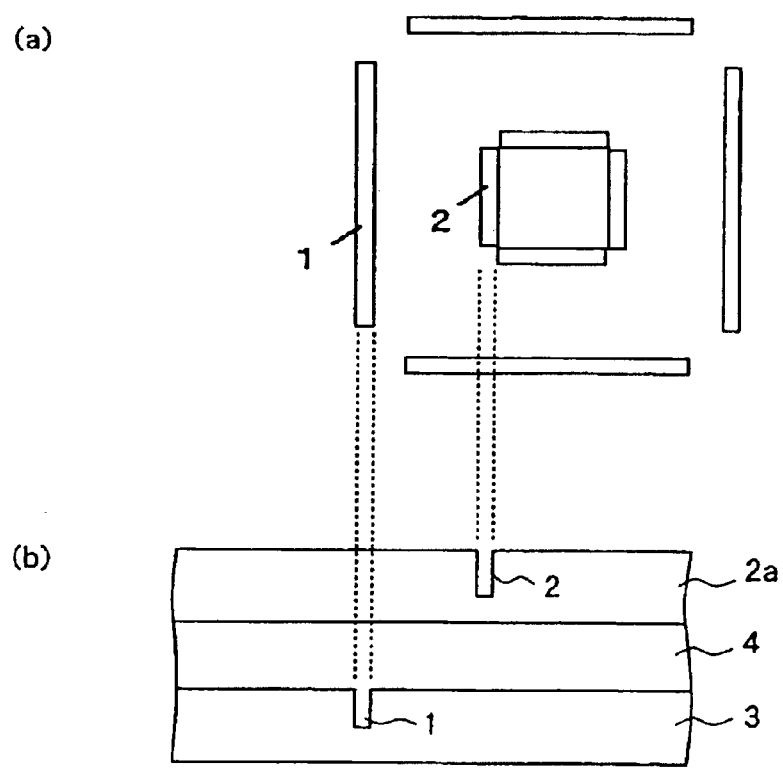
FIGS. 15(a) and 15(b) are a pair of schematic views showing another example of a conventional overlay mark.
Figure 16:
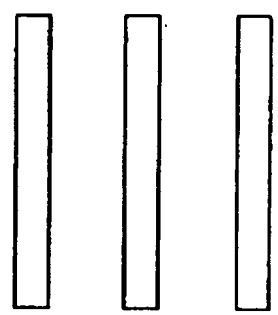
FIGS. 16(a) and 16(b) are a pair of schematic views, each showing an example of a conventional overlay mark (alignment marks.
Figure 16:
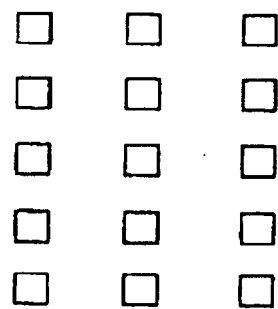
Figure 17:
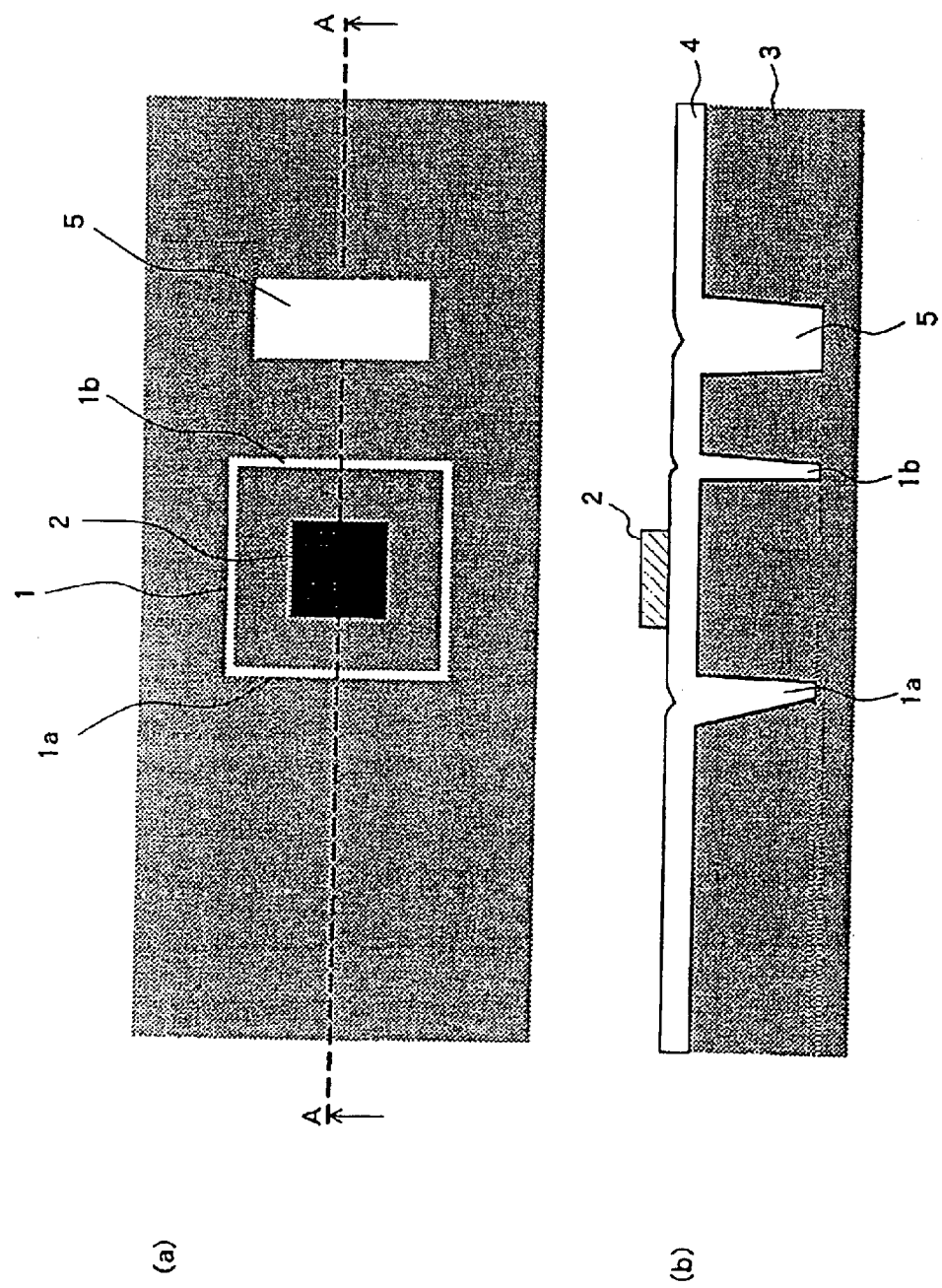
FIGS. 17(a) and 17(b) are a pair o schematic views showing a state in which a conventional overlay mark is deformed.

The formation of the overlay mark of the present embodiment is carried out as follows. First, concurrently with forming a first circuit pattern on the underlying layer 3, a first lower-layer pattern 1 as well as a second lower-layer pattern 21 are formed on the same underlying layer 3, each by engraving a groove in a prescribed position of the region such as a dicing line or the like by means of etching of the like. Next, an upper layer 4 (a second layer) onto which a second circuit pattern is to be formed is laid over that and, then, a resist layer is applied over this upper layer 4. Next, concurrently with patterning this resist layer into a second circuit pattern, this resist layer around the first and the second lower-layer patterns 1 and 21 is patterned into a polygon such as a square, a rectangle or the like, forming an upper-layer pattern 2 of the resist inside of the first lower-layer pattern 1. This upper-layer pattern 2 may be formed positively with a resist block in the shape of a polygon viewed from the top, as shown in FIG. 1, or alternatively, by setting negatively a depressed section (an indent) or an opening section in the shape of a polygon viewed from the top onto a resist layer 2a, as shown in FIG. 6(a). Further, as the upper-layer pattern shown in FIG. 14 or FIG. 15, this upper-layer pattern 2 may be formed by engraving a grooved pattern in the shape of a frame or bars onto a resist layer 2a. Further, it may be formed of resist block in the shape of a frame or bars.

As the shape and the layout of the pattern for the overlay mark of the present invention, a pattern shown in FIG. 1(a) can be given as an example. In this pattern, the first lower-layer pattern 1 is in the shape of a polygonal frame viewed from the top and the second lower-layer pattern 21 is also in the shape of a polygonal frame viewed from the top and surrounding the first lower-layer pattern 1 at a substantially equal interval. The polygonal shape for the first and the second lower-layer pattern, herein, is preferably a square as shown in FIG. 1(a), but can be a rectangle. Meanwhile, the upper-layer pattern 2 is a resist pattern in the shape of a polygon such as a square, a rectangle or the like, viewed from the top, and disposed inside of the first lower-layer pattern 1.

By surrounding the first lower-layer pattern 1 with the second lower-layer pattern at a substantially equal interval the second lower-layer pattern has an effect of relaxing thermal expansion or contraction of the underlying layer 3 and, in addition, the environment around the first lower-layer pattern 1 becomes structurally uniform and, therefore, the amount of thermal expansion or contraction of the underlying layer around the pattern becomes uniform, as well. This protects the overlay mark from non-uniform deformation and, consequently, suppresses the lowering of the accuracy of measurement for the overlay accuracy with effect.

As a possible form for the first lower-layer pattern 1 other than the frame-shaped pattern shown in FIG. 1(a), a pattern in which a pair of bar-shaped patterns are arranged parallel, facing each other with an upper-layer pattern between, as shown in FIG. 2(a), can be given. Further, the pattern can be the one in which four bar-shaped patterns are each disposed in place of a side of a quadrangle such as a square, a rectangle or the like. In this instance, an upper-layer pattern 2 is disposed between pairs of bar-shaped patterns and the second lower-layer pattern 21 is formed to surround the whole of the first lower-layer pattern 1. In any of these cases, when a heat enough to cause thermal expansion or contraction of the underlying layer 3 is applied, as shown in FIG. 2(b), for example, through the deformation of the pattern section 21a of the outermost second lower-layer pattern, the first lower-layer pattern 1 inside is protected from deformation. On this occasion, the sides of the frame-shaped grooved pattern running parallel to respective bar-shaped patterns in the first lower-layer pattern are each preferably disposed at an equal interval to the corresponding opposite bar-shaped patterns in the first lower-layer pattern.

While the afore-mentioned second lower-layer pattern 21 is disposed to surround both the first lower-layer pattern 1 and the upper-layer pattern 2, as shown in FIG. 1(a) and FIG. 2(a), if the first lower-layer pattern is composed of bar-shaped patterns, the second lower-layer pattern 21 may be formed to surround each bar-shaped pattern of the first lower-layer pattern separately, as shown in FIG. 3(a). Further, although FIG. 3(a) shows the case in which the first lower-layer pattern 1 is composed of bar-shaped patterns, all of which are arranged parallel to one direction, even in the case that four bar-shaped patterns are each disposed in place of a side of a quadrangle such as a square, a rectangle or the like, each bar-shaped pattern can be surrounded separately by a frame-shaped second lower-layer pattern in a similar manner. In these cases, too, the first lower-layer pattern 1 placed inside of the second lower-layer pattern 21 can be protected from deformation in the same way as described above (FIG. 3(b)).

Another pattern that can be given is a pattern in which, as shown in FIG. 4(b), a second lower-layer pattern 21 in the shape of a quadrangular frame viewed from the top surrounds the first lower-layer pattern 1 and the upper-layer pattern 2 and, in addition, a third lower-layer pattern 22 surrounds respective bar-shaped patterns of the first lower-layer pattern 1, separately in the shape of a quadrangular frame viewed from the top. In this case, because the first lower-layer pattern 1 is surrounded doubly by the second and the third lower-layer patterns, the first lower-layer pattern 1 placed inside of the second lower-layer pattern 21 can be still better protected from deformation (FIG. 4(b)).

In the above-mentioned embodiment, if the first lower-layer pattern 1 is composed of bar-shaped patterns, in the second and the third frame-shaped lower-layer patterns surrounding respective bar-shaped patterns, the sides of every frame-shaped pattern running parallel to respective bar-shaped patterns in the first lower-layer pattern are each preferably disposed at an equal interval to the corresponding opposite bar-shaped patterns in the first lower-layer pattern. In this way, the environment around the first lower-layer pattern 1 is made structurally uniform and, therefore, the amount of thermal expansion or contraction of the underlying layer around the pattern is made more uniform, as well. This protects the overlay mark from non-uniform deformation and, consequently, suppresses the lowering of the accuracy of measurement for the overlay accuracy with effect.

In the measurements of the overlay accuracy according to the present invention, more than sufficient accuracy of the measurement can be obtained by not using the second lower-layer pattern 21 that is the outermost lower-layer pattern in detecting the overlay position. However, when another pattern for prevention of the deformation is additionally set inside of the outermost lower-layer pattern like the third lower-layer pattern 22 shown in FIG. 4(b), a still higher accuracy of the measurement can be obtained by not using this pattern, either.

The pattern size of the overlay mark of the present invention is appropriately set, following the pattern length, the spacing of the patterns, the groove depth, the resist thickness and the like of the normal overlay mark for the measurement of the overlay accuracy. Only the depths of grooves in the second and the third lower-layer patterns are specifically required to be deep enough to protect well the first lower-layer pattern placed inside from deformation, and they are preferably almost equal to or deeper than the first lower-layer pattern. Since the first lower-layer pattern and the second and the third lower-layer patterns are normally formed simultaneously by etching, it is preferable that the depths of these grooves are set to be substantially the same.

Second Embodiment

Figure 5:
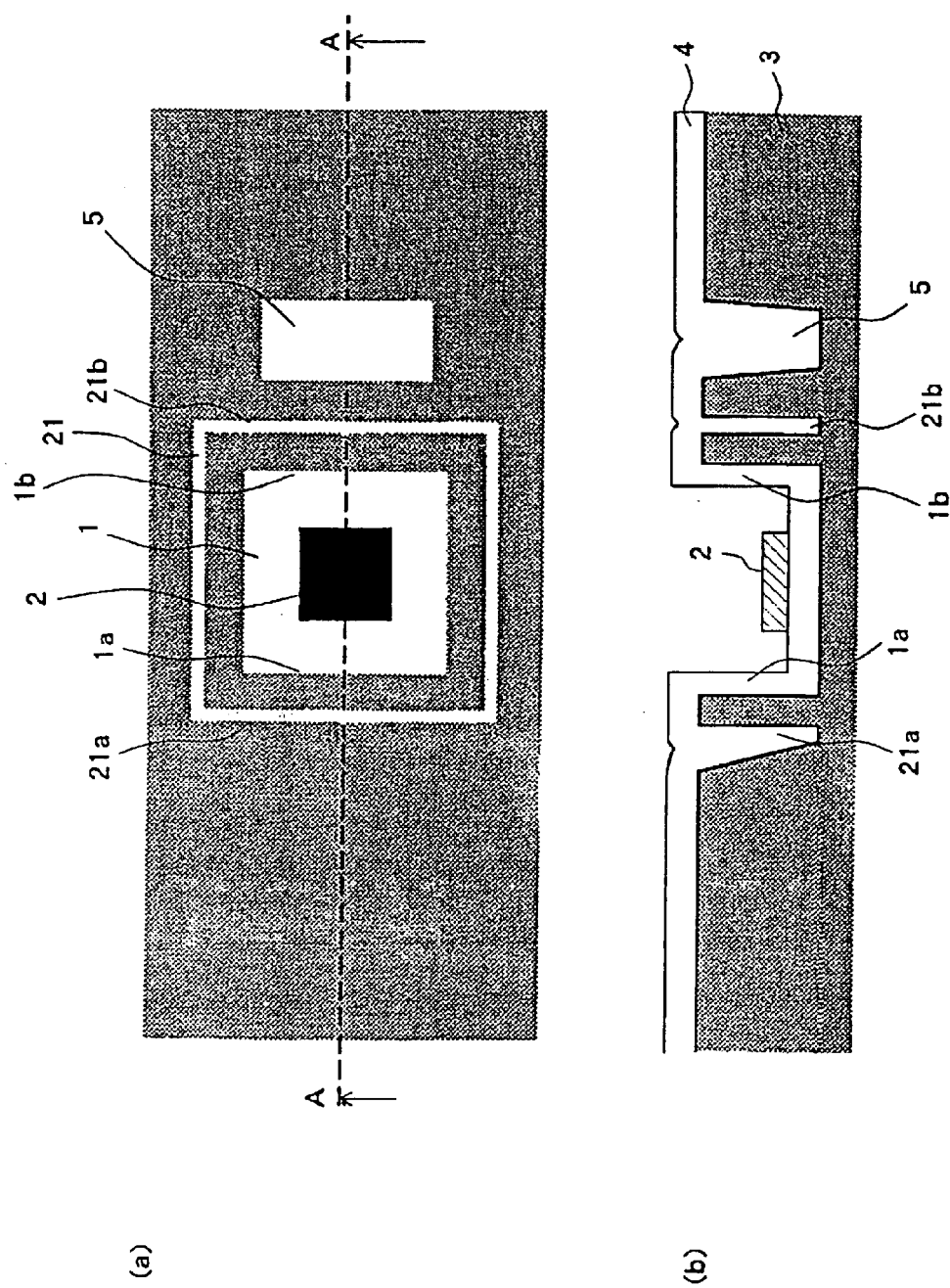
FIGS. 5(a) and 5(b) are a pair of schematic views illustrating the shape and the effect of another overlay mark that is another example of the present invention.

An example in which the present invention is applied to a box-in-box type mark is shown in FIG. 5. FIG. 5(a) is a plan view and FIG. 5(b) is a cross-sectional view taken along the line A—A of FIG. 5(a). Here, FIG. 5(a) shows the mark before deformation and FIG. 5(b), the mark after deformation due to thermal contraction.

The present embodiment is the same as the overlay mark of the first embodiment shown in FIG. 1, except that, as the first lower-layer pattern, a frame-shaped groove pattern is replaced with a depressed pattern in the shape of a polygon viewed from the top.

Further, the upper-layer pattern 2 can be formed of resist block in the shape of a polygon viewed from the top, as shown in FIG. 5, or alternatively, it can be formed by setting negatively a depressed section (an indent) or an opening section in the shape of a polygon viewed from the top onto a resist layer 2a, as shown in FIG. 6(b).

Third Embodiment

In the first embodiment described above, the upper-layer pattern 2 is a pattern that is formed by applying another layer on the upper layer 4 and made of a resist block in the shape of a polygon viewed from the top but, instead of this resist pattern, a pattern of groove that is formed by engraving the upper layer 4 can be utilized. Such a grooved pattern can be a pattern in the shape of a frame of a polygon such as a square, a rectangle or the like viewed from the top, a pattern in which bar-shaped patterns are arranged parallel, or a pattern in which bar-shaped patterns are each disposed in place of a side if of a polygon such as a square, a rectangle or the like. These grooved patterns may be formed by means of etching or the like, simultaneously with forming a second circuit pattern on the upper layer 4.

Fourth Embodiment

Next, there is described an example in which the present invention is applied to an overlay mark for making alignment (referred to as 'alignment mark', hereinafter) that is used to detect and decide an aligning position of a wafer and a mask, in the step of exposure during photolithography to form a second circuit pattern over a first circuit pattern.

In an alignment mark of the present invention, a first pattern is formed by engraving a groove in a prescribed position of the region such as a dicing line or the like on an underlying layer where a first circuit pattern is to be formed. To surround this first pattern, a frame-shaped second pattern is then formed by engraving a groove on the underlying layer. In other words, the alignment mark can take the same shape as the lower-layer pattern of the overlay mark for measurement of the overlay accuracy in any of the above embodiments.

The pattern size of the alignment mark of the present invention is appropriately set, following the pattern length, the spacing of the patterns, the groove depth and the like of the normal alignment mark. In the case that the detection of the mark is made by the same optical image-processing technique as the measurement of the overlay accuracy, it can be set to use the same lower-layer pattern both for the alignment mark and the overlay mark for the measurement of the overlay accuracy.

Further, with respect to the groove depth of the alignment mark, the groove depth of the outer pattern (the second pattern) is required to be deep enough to protect well the inner pattern (the first pattern) from deformation, and it is preferably almost equal to or deeper than the inner pattern. Since the outer pattern and the inner pattern are normally formed simultaneously by etching, it is preferable that the depths of these grooves are set to be substantially the same.

Now, referring to FIGS. 7–11, the pattern shape of the alignment mark is described.

Figure 7:
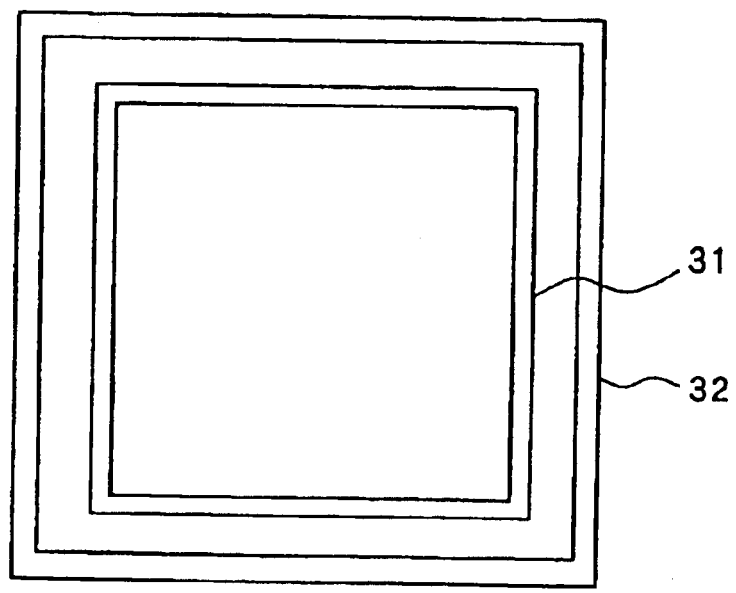
FIG. 7 is a schematic view showing the shape of an overlay mark (alignment mark) that is one example of the present invention.

In a pattern shown in FIG. 7, a frame-shaped first pattern 31 (an inner pattern) formed by engraving a groove on a layer where a first circuit pattern is to be formed is surrounded by a frame-shaped second pattern 32 (an outer pattern) formed similarly by engraving a groove thereon. This pattern shape is the same as the shape of the lower-layer pattern of the mark of the first embodiment shown in FIG. 1(*a*), and, also, the preferred shape and the effect brought about by this pattern shape are the same as described in the first embodiment.

Figure 8:
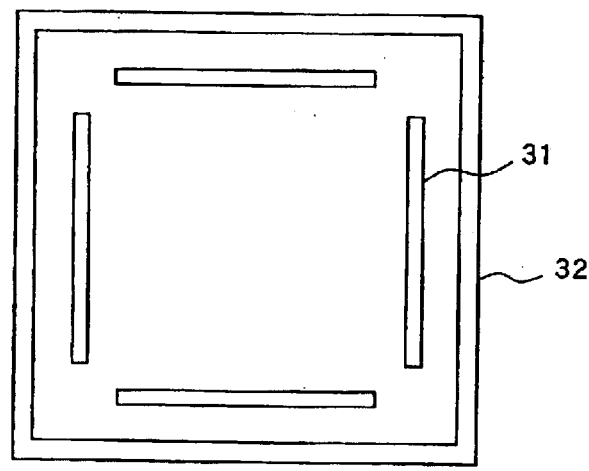
FIG. 8 is a schematic view showing the shape of another overlay mark (alignment mark) that is another example of the present invention.
Figure 10:
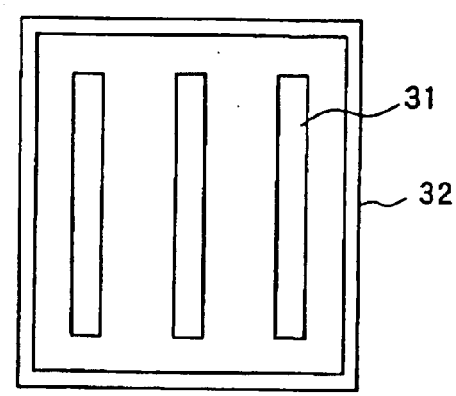
FIG. 10 is a schematic view showing the shape of another overlay mark (alignment mark) that is another example of the present invention.
Figure 11:
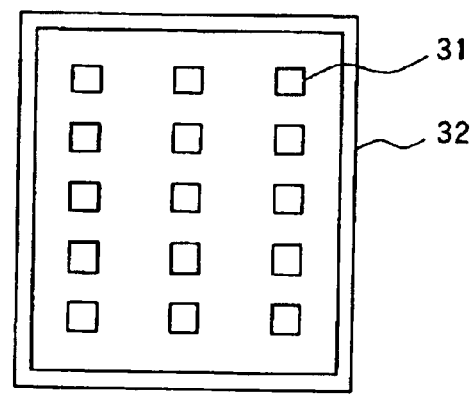
FIG. 11 is a schematic view showing the shape of another overlay mark (alignment mark) that is another example of the present invention.
Figure 12:
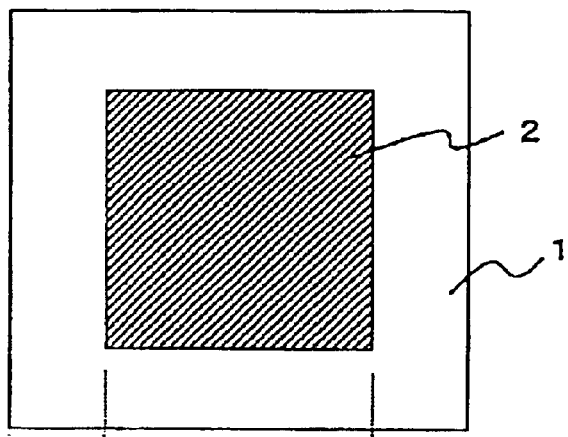
FIGS. 12(a) and 12(b) are a pair of schematic views showing an example of a conventional overlay mark.
Figure 12:
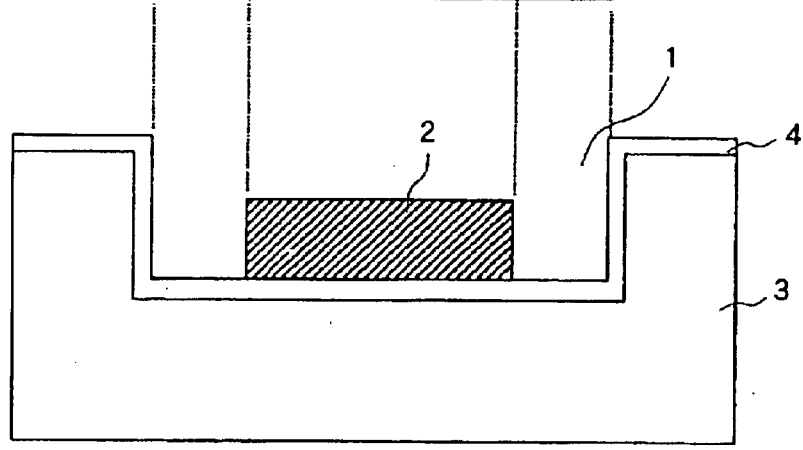
Figure 13:
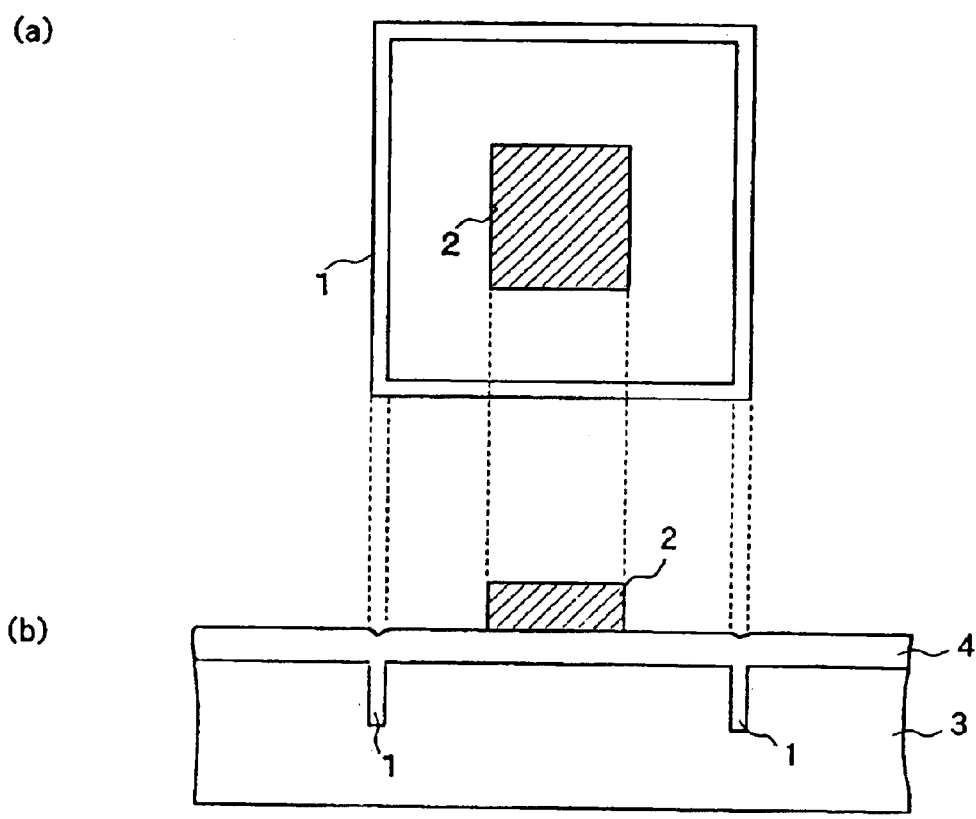
FIGS. 13(a) and 13(b) are a pair of schematic views showing another example of a conventional overlay mark.

A pattern shown in FIG. 8 is an example of patterns that are the same as the pattern shown in FIG. 7, except that, as the first pattern 31 therein, a pattern comprising two pairs of parallel bar-shaped patterns, wherein each bar-shaped pattern is disposed in place of a side of a polygon such as a square, a rectangle or the like, replaces a frame-shaped polygonal pattern. As a possible form for the first pattern 31, a line and space pattern comprising parallel arrays of bar-shaped patterns as shown in FIG. 10 can be given. Further, as the first pattern 31, a pattern of a plurality of indents (depressed sections), each in the shape of a polygon such as a square, a rectangle or the like being arranged in a line and a pattern of a plurality of parallel arrays each of which is an array of these indents, as shown in FIG. 11, can be used. With any of these patterns, the function and the effect obtained through the formation of the outer pattern 32 are the same as described for the lower-layer pattern in the first embodiment.

Figure 9:
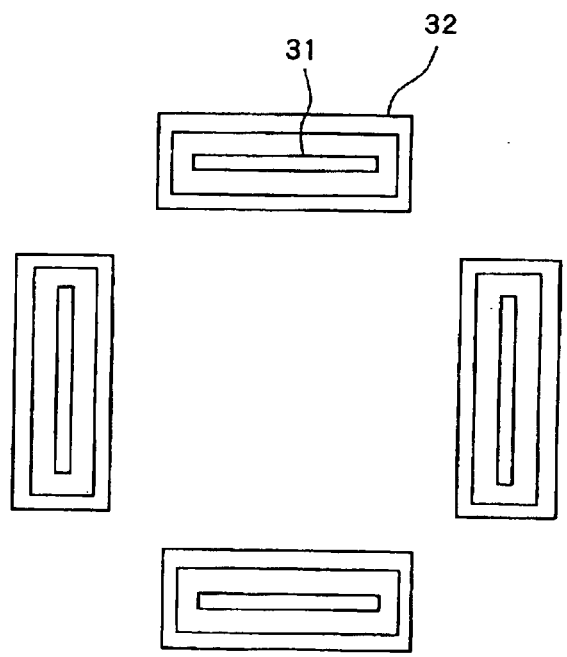
FIG. 9 is a schematic view showing the shape of another overlay mark (alignment mark) that is another example of the present invention.

A pattern shown in FIG. 9 is a pattern wherein a first pattern 31 is composed of bar-shaped patterns, and a second pattern 32 is formed to surround each bar-shaped pattern separately. While, in FIG. 9, the first pattern 31 is a pattern comprising two pairs of parallel bar-shaped patterns, wherein each bar-shaped pattern is disposed in place of a side of a polygon such as a square, a rectangle or the like, it can be a pattern in which all bar-shaped patterns are parallel to each other and arranged to one direction. This pattern shape is the same as the shape of the lower-layer pattern of the overlay mark of the first embodiment shown in FIG. 3(*a*), and, also, the preferred shape and the effect brought about by this pattern shape are the same as described in the first embodiment.

Further, a grooved pattern in the shape of a quadrangular frame can be formed to surround the whole of the pattern shown in FIG. 9.

Fifth Embodiment

When the mark for the measurement of the overlay accuracy and the alignment mark of the present invention described above are used in the formation of a multi-layered circuit pattern of a semiconductor device or a liquid crystal panel, a multi-layered circuit pattern can be formed with a high accuracy and a high yield in production, even in the formation of a minute and densely-spaced circuit pattern.

Further, the alignment mark of the present invention can be utilized, if the shape and the layout thereof are set appropriately, not only for the measurement of the overlay accuracy between the first circuit pattern and the second circuit pattern, but also as a lower-layer pattern for detecting the position of the first circuit pattern. In other words, the lower-layer pattern of the overlay mark for the measurement of the overlay accuracy of the present invention can be used as an alignment mark. On that occasion, the internal pattern is preferably bar-shaped pattern or as frame-shaped pattern, and more preferably a line and space pattern comprising bar-shaped patterns.

One embodiment of a method of forming a multi-layered circuit pattern using the overlay mark for measurement of the overlay accuracy shown in FIG. 1 and the alignment mark shown in FIG. 7 is described.

First, on a first layer where a first circuit pattern is formed, an alignment mark shown in FIG. 7 is formed, concurrently with forming a first circuit pattern. Next, a second layer where a second circuit pattern is to be formed is laid over that and, subsequently, a resist layer is applied over this second layer.

Next, using the alignment mark formed on the first layer, alignment is made and, then, a second circuit pattern is transcribed by exposure through a mask.

Here, as the mask mentioned above, the one having a pattern to form an upper-layer pattern 2 of the overlay mark for measurement of the overlay accuracy is used, and, in this way, the upper-layer pattern is transcribed onto the resist layer inside of the alignment pattern, concurrently with transcribing the second circuit pattern.

Next, by carrying out development, the upper-layer pattern 2 made of the resist is formed, together with forming a resist pattern for formation of the second circuit pattern. This upper-layer pattern 2 and the alignment pattern constitute an overlay mark for measurement of the overlay accuracy, so with the overlay mark, the overlay accuracy is measured. The alignment mark used herein corresponds to the first lower-layer pattern 1 and the second lower-layer pattern 21 shown in FIG. 1.

If, the overlay deviation is within a prescribed value, the wafer in question is sent to the next etching step. On the other hand, if the overlay deviation exceeds a prescribed value, the resist pattern is removed and the steps of applying a coating of a resist, exposing and developing are carried out for the second time.

In the step of forming patterns described above, once the first layer is formed, even if various heatings are applied till the time of exposure, only the outermost pattern may be deformed within the pattern of the mark formed on the first layer, and the inner pattern is well protected from deformation. Leaving out the deformed outermost pattern from the operation of the alignment or measurement of the overlay accuracy, the alignment or the measurement of the overlay accuracy can be made with a high accuracy.

Further, examples of a heating that may be applied thereto between the time of the first layer formation and the time of exposure include heat treatments performed to improve characteristics of various layers, for example, a hardening; heat treatments performed for planarization, for example, a reflow of a thermally soft film such as a BPSG; annealings performed to improve crystallinity of a substrate or dopant profile; and heatings at the time of forming a third layer, such as a nitride film, a capacitor insulating film or the like, between the first layer and the second layer.

What is claimed is:

1. An overlay mark having a mark pattern formed by engraving one of a groove and an indent in a prescribed position on a layer where a circuit pattern is formed, and a grooved pattern that surrounds said mark pattern so as to protect said mark pattern from being deformed by thermal expansion or contraction of said layer.

2. A semiconductor device, comprising:
    a substrate on which the overlay mark according to claim 1 is formed.

3. The overlay mark according to claim 1, wherein said groove pattern is formed to surround said mark pattern at a substantially equal interval.

4. The overlay mark according to claim 1, wherein said grooved pattern is at least as deep as said mark pattern.

5. An overlay mark used for measuring the overlay accuracy in forming a second circuit pattern over a first circuit pattern, comprising:
    a first lower-layer pattern formed by engraving one of a groove and an indent in a prescribed position on a first layer where the first circuit pattern is formed;
    an upper-layer pattern formed in a prescribed position on a second layer where the second circuit pattern is to be formed; and
    a second lower-layer pattern that is formed by engraving, on the first layer, a frame-shaped groove to surround the first lower-layer pattern, and is not used for measuring the overlay accuracy.

6. The overlay mark according to claim 5, wherein the first lower-layer pattern is utilized as an alignment mark at the time of alignment to superimpose a mask onto a wafer during exposure.

7. The overlay mark according to claim 5, wherein: the first lower-layer pattern comprises one of a grooved pattern in the shape of a polygonal frame viewed from the top and a polygonal depressed pattern; and
    wherein the second lower-layer pattern is a grooved pattern in the shape of a polygonal frame viewed from the top, being formed to surround the first lower-layer pattern at a substantially equal interval.

8. The overlay mark according to claim 5, wherein: the first lower-layer pattern comprises a grooved pattern in which, viewed from the top, a pair of bar-shaped patterns are arranged parallel, facing each other with the upper-layer pattern between;
    wherein the second lower-layer pattern comprises a grooved pattern in the shape of a quadrangular frame viewed from the top, and is formed to surround the whole of the first lower-layer pattern, and
    wherein sides of said frame-shaped grooved pattern running parallel to respective bar-shaped patterns in the first lower-layer pattern are disposed at an equal interval to the corresponding opposite bars-shaped pattern.

9. The overlay mark according to claim 8, further comprising:
    a third lower-layer pattern, in a region surrounded by the second lower-layer pattern on the first layer, formed by engraving grooves to surround every bar-shaped pattern of the first lower-layer pattern separately, each in the shape of a frame,
    wherein: sides of said third lower-layer pattern running parallel to respective bar-shaped patterns in the first lower-layer pattern are disposed at an equal interval to the corresponding opposite bar-shaped pattern, the third lower-layer pattern is not used for measuring the overlay accuracy.

10. The overlay mark according to claim 5, wherein: the first lower-layer pattern comprises a grooved pattern in which, viewed from the top, a pair of bar-shaped patterns are arranged parallel, facing each other with the upper-layer pattern between,
    wherein the second lower-layer pattern comprises a grooved pattern comprising patterns, each in the shape of a quadrangular frame viewed from the top and formed to surround respective bar-shape d patterns of the first lower-layer pattern, and
    wherein sides of said frame-shaped grooved pattern running parallel to respective bar-shaped patterns in the first lower-layer pattern are disposed at an equal interval to the corresponding opposite bar-shaped pattern.

11. The overlay mark according to claim 5, wherein said upper-layer pattern is formed from a resist layer laid over the second layer and comprises a pattern in the shape of one of a polygon, a frame and a bar viewed from the top.

12. A semiconductor device, comprising:
    a substrate on which the overlay mark according to claim 5 is formed.

13. A method of measuring the overlay accuracy in forming a second circuit pattern over a first circuit pattern, wherein the overlay mark according to claim 5 is used but, at least, the outermost lower-layer pattern is not utilized to detect an overlay position.

14. The overlay mark according to claim 5, wherein said second lower-layer pattern absorbs thermal expansion and contraction of an underlying layer.

15. The overlay mark according to claim 5, wherein said groove of said second lower-layer is at least as deep as groove of said first lower-layer.

16. An overlay mark used for making alignment to detect and decide an aligning position of a wafer and a mask, during photolithography to form a second circuit pattern over a first circuit pattern, comprising:
    a first pattern formed by engraving one of a groove and an indent in a prescribed position on a layer where the first circuit pattern is formed; and
    a second pattern that is formed by engraving a frame-shaped groove to surround the first pattern, and is not used for making alignment.

17. The overlay mark according to claim 16, wherein: the the first pattern comprises a grooved pattern in the shape of a polygonal frame viewed from the top, and
    wherein the second pattern comprises a grooved pattern in the shape of a polygonal frame viewed from the top, being formed to surround the first pattern at a substantially equal interval.

18. The overlay mark according to claim 16, wherein: the first pattern comprises a grooved pattern in which, viewed from the top, bar-shaped patterns are arranged parallel, and wherein the second pattern comprises a grooved pattern in the shape of a quadrangular frame viewed from the top, and is formed to surround the whole of the first pattern, wherein sides of said frame-shaped grooved pattern running parallel to respective bar-shaped patterns in the first pattern are disposed at an equal interval to the corresponding opposite bar-shaped pattern.

19. The overlay mark according to claim 18, further comprising:

a third pattern, in a region surrounded by the second pattern on the layer where the first circuit pattern is formed, formed by engraving grooves to surround every bar-shaped pattern of the first pattern separately, each in the shape of a frame, wherein: sides of said third pattern running parallel to respective bar-shaped patterns in the first pattern area disposed at an equal interval in the corresponding opposite bar-shaped pattern; while the third pattern is not used for making alignment.

20. The overlay mark according to claim 19, wherein, a pattern in which quadrangular indents are arranged in a line is formed in place of said bar-shaped pattern.

21. The overlay mark according to claim 19, wherein said third pattern comprises a groove pattern, said second pattern and said third pattern are each at least as deep as said first pattern.

22. The overlay mark according to claim 19, wherein said third pattern, said second pattern and said first pattern each comprise a groove of substantially the same depth.

23. The overlay mark according to claim 18, wherein, a pattern in which quadrangular indents are arranged in a line is formed in place of said bar-shaped pattern.

24. The overlay mark according to claim 16, wherein: the first pattern comprises a grooved pattern in which, viewed from the top, bar-shaped patterns are arranged parallel, wherein the second pattern comprises a grooved pattern comprising patterns, each in the shape of a quadrangular frame viewed from the top and formed to surround respective bar-shaped patterns of the first pattern, and wherein sides of said frame-shaped grooved pattern running parallel to respective bar-shaped patterns in the first pattern are disposed at an equal interval to the corresponding opposite bar-shaped pattern.

25. The overlay mark according to claim 24, wherein, a pattern in which quadrangular indents are arranged in a line is formed in place of said bar-shaped pattern.

26. A semiconductor device, comprising:

a substrate on which the overlay mark according to claim 16 is formed.

27. A method of making alignment to detect and decide an aligning position of a wafer and a mask, in the step of exposure during photolithography to form a second circuit pattern over a first circuit pattern, wherein the overlay mark according to claim 16 is used but, at least, the outermost pattern is not utilized to detect an aligning position.

* * * * *